United States Patent [19]

Kiyohara

[11] Patent Number: 4,740,687
[45] Date of Patent: Apr. 26, 1988

[54] LIGHT PULSE DETECTING DEVICE WITH IMPROVED RESPONSE CHARACTERISTIC UTILIZING CASCODE-CONNECTED LIGHT SENSITIVE DEVICE

[75] Inventor: Shuichi Kiyohara, Kanagawa, Japan

[73] Assignee: Canon Kabushiki Kaisha, Tokyo, Japan

[21] Appl. No.: 833,807

[22] Filed: Feb. 26, 1986

[30] Foreign Application Priority Data

Feb. 28, 1985 [JP] Japan .................................. 60-039062

[51] Int. Cl.$^4$ ............................................. H01J 40/14
[52] U.S. Cl. ................................. 250/214 R; 330/308; 307/311
[58] Field of Search ..................... 250/214 R, 214 RC; 307/311, 396 R; 330/308, 59

[56] References Cited

U.S. PATENT DOCUMENTS

| 3,786,264 | 1/1974 | Ferro et al. | 250/214 R |
| 3,867,628 | 2/1975 | Brown | 250/214 R |
| 3,946,241 | 3/1976 | Malinowski | 250/214 R |
| 4,485,301 | 11/1984 | Gontowski, Jr. et al. | 307/311 |

Primary Examiner—David C. Nelms
Assistant Examiner—Jessica L. Ruoff
Attorney, Agent, or Firm—Toren, McGeady & Associates

[57] ABSTRACT

A light pulse detecting device having a photo-transistor whose output is compared with a level to detect incidence of a light pulse thereon. In this device, the photo-transistor is provided with other transistors cascode-connected thereto. For this reason, the capacitance of the emitter-collector path of the photo-transistor becomes equivalently smaller, improving the response characteristic of the light pulse detecting device.

8 Claims, 3 Drawing Sheets

LIGHT PULSE DETECTING DEVICE WITH IMPROVED RESPONSE CHARACTERISTIC UTILIZING CASCODE-CONNECTED LIGHT SENSITIVE DEVICE

BACKGROUND OF THE INVENTION

1. Field of the Invention

This invention relates to light pulse detecting devices for detecting quantity of pulsatingly changing light and, more particularly, to light pulse detecting devices most suited to light encoders.

2. Description of the Prior Art

In the past, this kind of device was constructed as shown in FIG. 1, where a reference voltage source Vref is connected to the base electrode of an NPN transistor 1 of which the emitter is grounded through a resistor 2 and the collector is connected to the input of a current mirror comprised of PNP transistors 3, 4 and 5, so that a current equal to the collector current of the NPN transistor 1, flows out from the collector of the transistor 4 which is the output of the current mirror. The collector of the transistor 4 is connected to the collector of a photo-transistor 6 with their junction el connected to the positive input terminal of a comparator 7. The emitter of the photo-transistor 6 is grounded. The negative input terminal of the comparator 7 is connected to the reference voltage source Vref.

The operation:

The voltage across the base-emitter path of the transistor 1 is assumed to be VBE. Then, a voltage of Vref - VBE appears across both ends of the resistor 2. So, a current flowing from the emitter of the transistor 1 has a value of (Vref−VBE)/R2, where R2 is the resistance value of the resistor 2. Also, an almost equal current flows to the collector of the transistor 1. By the current mirror of transistors 3, 4 and 5, the collector of the photo-transistor 6 is supplied with current of intensity almost equal to (Vref−VBE) / R2.

At first, the photo-transistor 6 is exposed to light so intense that the collector current of the photo-transistor 6 exceeds (Vref−VBE) / R2. As the potential at the collector of the photo-transistor 6 then reaches the saturation voltage of the photo-transistor 6, falling below the reference voltage Vref, the comparator 7 produces an output in the form of the low voltage. Next, as the light quantity on the photo-transistor 6 is not so large, when the intensity of the collector current of the photo-transistor 6 decreases from (Vref−VBE) / R2, the potential at the collector of the photo-transistor 6 changes to (Vcc - VCEsat4 (saturation voltage of transistor 4)), being higher than the reference voltage Vref, and the comparator 7 changes its output voltage to a high level.

For pulsating variations of the light on the photo-transistor 6, the potentials at the various points in the circuit of FIG. 1 take the waveforms shown in FIG. 2.

As the light varies in the form of pulses hv, the potential el at the collector of the photo-transistor 6 varies from its saturation voltage to VCC (the battery voltage)−VCEsat4. Because of a parasitic capacitance of the photo-transistor 6 and transistor 4, as shown on line el in FIG. 2, its rising and falling are delayed. Since, in this case, the range of variation of the potential el is so large, from the saturation voltage of the photo-transistor 6 to VCC−VCEsat4, the amount of charge necessary to charge-to-discharge the parasitic capacitance also becomes large. Thus, the delay of the rising and falling of the potential el takes a very long time. For this reason, the time gap tl, from the moment at which the rising edge of the light pulse has occurred to the moment at which the comparator 7 changes its output, tends to increase objectionably. Another drawback which was very serious was that as the width of the light pulse and the light quantity incident on the photo-transistor 6 decrease, the potential el becomes unable to reach the reference voltage Vref of the comparator 7 during the time when the photo-transistor 6 is exposed to the light, making it impossible to detect the incidence of the light pulse.

In application of such a light pulse detecting device to the light encoder, therefore, the possibility of failing to detect the light pulses was very high. So, an attempt has been made to improve the response characteristic of the light pulse detecting device by increasing the intensity of current flowing to the light-emitting element or LED of the light encoder with increase in the intensity of emitted light so that the intensity of light on the photo-transistor 6 increases.

However, the use of this method leads to consume a very large amount of electrical energy by the light-emitting element when a train of light pulses are produced. Such a light pulse detecting device was, therefore, not suited to be used in instruments of small size, such as cameras, whose electrical power source is a dry battery of small capacity, as constituting part of a light encoder, for example, the conversion of the moved amount of the diaphragm control ring or the axial movement of the focusing or zoom lens unit to an electrical signal by using a photo-interrupter.

SUMMARY OF THE INVENTION

An object of the invention is to provide a light pulse detecting device which has eliminated the above-described drawbacks of the prior known device.

To achieve this, according to the present invention, a number of transistors are cascode-connected to the photo-transistor, thereby, the parasitic capacitance of the photo-transistor is equivalently reduced. This makes it possible to provide a light pulse detecting device of high light response characteristic.

BREIF DESCRIPTION OF THE DRAWINGS

DETAILED DESCRIPTION OF THE PREFERRED EMBODIMENTS

Figure 1:
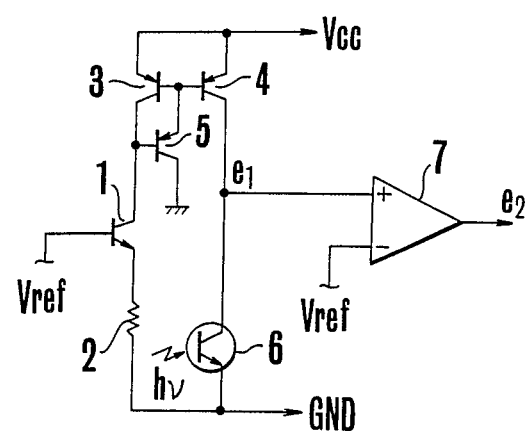
FIG. 1 is an electrical circuit diagram of the prior known light pulse detecting device.
Figure 3:
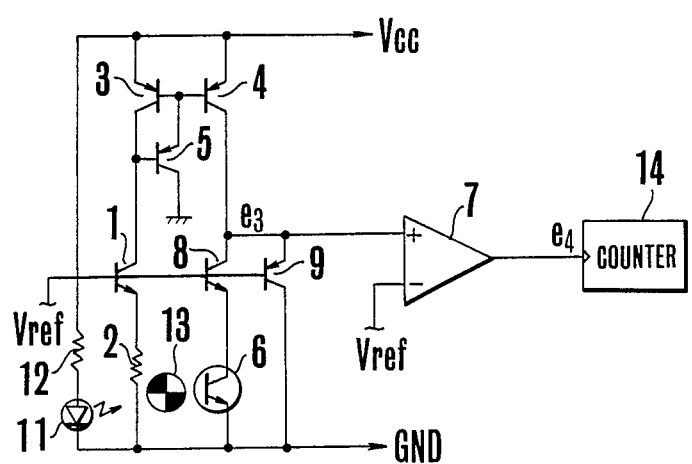
FIG. 3 is an electrical circuit diagram of a first embodiment of the invention.

In FIG. 3 there is shown a first embodiment of a light pulse detecting device according to the present invention applied to a light encoder, wherein the same reference characters have been employed to denote the similar parts to those shown in FIG. 1. The base of the NPN transistor 1 is connected to the reference voltage source Vref, and its collector is connected to the input of the current mirror of the PNP transistors 3 to 5. The current, equal to the collector current of the NPN transistor 1, flows out of the output of the current mirror or the collector of the transistor 4. Connected to the collector of the transistor 4 are the positive input terminal of the comparator 7, the collector of an NPN transistor 8, and the emitter of another PNP transistor 9. The bases of the transistors 8 and 9, as light sensitive elements, are connected to the same reference voltage source Vref as that connected to the base of the transistor 1. The collector of the transistor 9 is connected to a ground bus GND. The emitter of the transistor 8 is connected to the collector of the photo-transistor 6. The emitter of the photo-transistor 6 is connected to GND. The negative input terminal of the comparator 7 is connected to the reference voltage source Vref. An LED 11 and a rotatable encode disc 13, in a space between the LED 11 and the photo-transistor 6, constitute a light encoder together with the photo-transistor 6. A current-limiting resistor 12 lies between the battery Vcc and the anode of the LED 11. The encode disc 13 has slits as shown in the drawing and is arranged to rotate a corresponding number of revolutions to the moved amount of a member (not shown). A counter 14, receptive of the output of the comparator 7, in the form of a number of changes in level, produces an output in the form of a digital signal representing the moved amount of the aforesaid member.

Next, explanation is given to the operation of the circuit of FIG. 3.

The voltage across the base-emitter path of the transistor 1 is assumed to be VBE. Then, a voltage of Vref - VBE appears across both ends of the resistor 2. Hence, a current, flowing from the emitter of the transistor 1, has a value of (Vref−VBE) / R2, where R2 is the resistance value of the resistor 2. Also, an almost equal current flows to the collector of the transistor 1. By the current mirror of transistors 3, 4 and 5, the collector of the photo-transistor 6 is supplied with current of intensity almost equal to (Vref−VBE) / R2.

At first, the encode disc 13 is first assumed to clear the light path from the LED 11 to the photo-transistor 6 of its light-blocking portion (shown black in FIG. 3). Then when the collector current of the photo-transistor 6 is higher than (Vref−VBE) / R2, the transistor 8 is saturated. Letting the voltage across the base-emitter path of the transistor 8 be denoted by VBE8, and its saturation voltage by VCEsat8, the potential e3 is found to be Vref−(VBE8−VCEsat8)<Vref (where VBE8>VCEsat8). Hence, the comparator 7 produces an output of the low level. In this case, because the potential e3 is lower than the reference voltage Vref, the transistor 9 is in OFF the state. Then, as the encode disc 13 rotates in response to movement of the aforesaid member, when the light path is interrupted by the opaque portion of the encode disc 13, the intensity of the light on the photo-transistor 6 becomes so low that the collector current (Vref−VBE) / R2 of the photo-transistor 6 falls below the level (Vref−VBE). This causes the potential e3 to become (Vref+VBE9)>Vref, where VBE9 is voltage across the base-emitter path of the transistor 9. Responsive to this, the comparator 7 changes its output to the high level. As rotation of the code disc 13 goes on, such a change of the output of the comparator 7 is repeated, while the number of changes of the output of the comparator 7 is counted by the counter 14.

Figure 4:
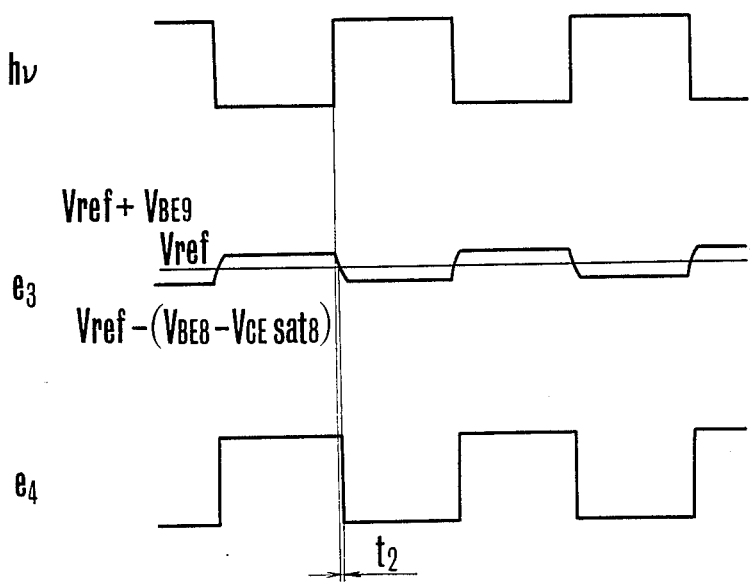
FIG. 4 is waveforms illustrating a manner in which the circuit of FIG. 3 operates.

For a train of light pulse formed on the photo-transistor 6 by the rotating encode disc 13, the potentials e3 and e4 at the positive input and output of the comparator 7 vary as shown in FIG. 4. "hv" represents the quantity of light incident on the photo-transistor 6.

Figure 2:
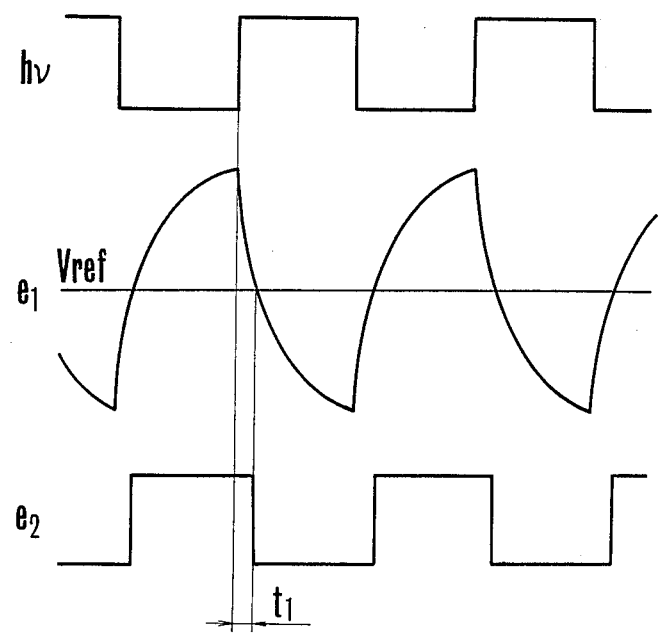
FIG. 2 is waveforms illustrating a manner in which the device of FIG. 1 operates.

As will be understood from the foregoing description, because the range of variation of the potential e3 from Vref−(VBE8−VCEsat8) to Vref+VBE9 is remarkably reduced from that of variation of the potential el in the prior known device of FIG. 2, a smaller amount of charge suffices for charging or discharging the parasitic capacitance of the transistors 8 and 9. Also, because the cascode-connection of the transistor 8 ensures the fixing of the potential at the collector of the photo-transistor 6 to Vref−VBE8, the parasitic capacitance of the photo-transistor 6 has little influence on it. In conclusion, the time necessary for the rising and falling of the potential e3 is very shortened. Thus, a great reduction of the response deferring time t2, from the moment at which the rising edge of the light pulse has occurred to the moment at which the output of the comparator 7 reverses, has been achieved.

The use of such a light pulse detecting device in the light encoder, therefore, provides a possibility of diminishing the influence of the response lag of the photo-transistor to such a level as is negligible in actual practice. As the necessity of employing the conventional method of flowing much current to the LED 11 by decreasing the resistance value of the resistor 12 is obviated, the wasteful consumption of electrical energy can be saved, while still permitting the accuracy of detection of light pulses to be increased.

Though, in the embodiment of FIG. 3, the transistor 8 that is cascode-connected to the photo-transistor 6 also serves as a clamp circuit, this is not always necessary. Hence, this clamp circuit may be otherwise formed by not relying, on the transistor 8 that is cascode-connected to the photo-transistor 6 as in another embodiment of the invention shown in FIG. 5.

Figure 5:
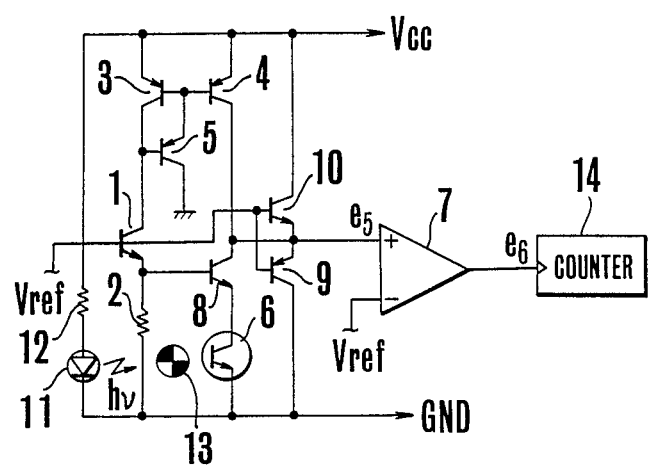
FIG. 5 is an electrical circuit diagram of a second embodiment of the invention.

In FIG. 5, the same reference characters have been employed to denote the similar parts to those shown in FIG. 3. The base of the transistor 8 is connected to the emitter of the transistor 1. A transistor 10 has its base connected to the reference voltage source Vref, its collector connected to the battery voltage Vcc and its emitter conected to the collector of the transistor 4, the collector of the transistor 8, the emitter of the transistor 9 and the positive input terminal of the comparator 7.

Even in such a structure of circuit, the collector potential of the photo-transistor 6 is fixed to Vref−VBE1−VBE8 so that the parasitic capacitance of the photo-transistor 6 has little influence. Also because the potential e5 slightly changes from Vref−VBE10 to Vref+VBE9, a smaller amount of charge suffices for charging and discharging the combined parasitic capacitance of the transistors 4, 8, 9 and 10, and the time necessary for the rising and falling of the potential e5 is shortened. For this reason, the response lag to the light pulse is very short. Therefore, such an embodiment has an equivalent advantage to that of the first embodiment.

As has been described above, according to the present invention, use is made of a transistor cascode-connected to the photo-transistor in the light pulse detecting device, thereby, it being made possible to equivalently reduce the capacitance across the emitter-collector path of the photo-transistor. This enables the light pulse detecting device to have a higher light response characteristic.

What is claimed is:

1. A light detecting apparatus comprising:

(a) light sensitive means for detecting light pulses and for producing an electrical signal proportional to light incident thereon, the light sensitive means having two electrodes;

(b) means having an output terminal to supply a reference voltage;

(c) a first transistor having a base electrode connected to the output terminal of said reference voltage supply means, an emitter electrode connected to one of the electrodes of the light sensitive means, and a collector electrode;

(d) a second transistor having a base electrode connected to the output terminal of said reference voltage supply means, an emitter electrode connected to the collector electrode of the first transistor and a collector electrode connect to the ground; and (e) output means for detecting the level of the collector of said first transistor in response to change of said level to produce an output signal representing a light pulse of the incident light.

2. A light detecting apparatus according to claim 1, wherein said output means includes a comparator having one input terminal connected to the collector of said first transistor.

3. A light detecting apparatus according to claim 2, wherein said comparator further includes another input terminal connected to an output of a reference voltage supply circuit representing a level of voltage of the reference voltage supply means.

4. A light detecting apparatus according to claim 3, wherein said comparator includes an operational amplifier having two input terminals.

5. A light detecting apparatus comprising:
(a) light sensitive means for detecting light pulses and for producing an electrical signal proportional to light incident thereon, the light sensitive means having two electrodes;

(b) means having an output terminal to supply a reference voltage;

(c) a first transistor cascode-connected to said light sensitive means, the first transistor having a control electrode connected to the output terminal of said reference voltage supply means, a first main electrode connected to the light sensitive means and a second main electrode forming an output terminal;

(d) a second transistor being of a type different from the first transistor and having two main electrodes with one of the main electrodes being connected to the second main electrode of the first transistor; and (e) output means for detecting an output level of the second main electrode of the first transistor to produce an output representing a light pulse of the incident light.

6. A light detecting apparatus according to claim 5, wherein said first transistor is an npn transistor and said second transistor is a pnp transistor.

7. A light detecting apparatus comprising:
(a) light sensitive means for detecting light pulses and for producing an electrical signal proportional to light incident thereon, the light sensitive means having two electrodes;

(b) means having an output terminal to supply a reference voltage;

(c) a first transistor cascode-connected to said light sensitive means, the first transistor having a control electrode connected to the output terminal of said reference voltage supply means, a first main electrode connected to the light sensitive means and a second main electrode forming an output terminal; and (d) output means for detecting an output level of the second main electrode of the first transistor to produce an output representing a light pulse of the incident light.

8. A light detecting apparatus according to claim 7, wherein said first transistor is an npn transistor.

* * * * *